United States Patent
Hu et al.

(10) Patent No.: US 9,053,790 B1
(45) Date of Patent: Jun. 9, 2015

(54) COUNTER FOR WRITE OPERATIONS AT A DATA STORAGE DEVICE

(71) Applicant: SANDISK TECHNOLOGIES INC., Plano, TX (US)

(72) Inventors: Xinde Hu, San Diego, CA (US); Manuel Antonio D'Abreu, El Dorado Hills, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/321,058

(22) Filed: Jul. 1, 2014

(51) Int. Cl.
*G11C 11/00* (2006.01)
*G11C 13/00* (2006.01)

(52) U.S. Cl.
CPC .................................. *G11C 13/0069* (2013.01)

(58) Field of Classification Search
CPC ........ G11C 11/00; H01L 45/00; H01L 21/00; H01L 21/16; H01L 23/485; H01L 29/02; H01L 47/00
USPC .................................. 365/148, 163, 236, 100
See application file for complete search history.

(56) References Cited

U.S. PATENT DOCUMENTS

| 2007/0070692 A1 | 3/2007 | Mokhlesi |
| 2007/0260811 A1 | 11/2007 | Merry, Jr. et al. |
| 2010/0277968 A1 * | 11/2010 | Tokiwa ........................ 365/148 |

OTHER PUBLICATIONS

"Wear Leveling," Wikipedia, the Free Encyclopedia, http://en.wikipedia.org/wiki/Wear_leveling, printed Jul. 1, 2014, 4 pages.
Shen, "System and Method of Counting Program/Erase Cycles", U.S. Appl. No. 14/480,306, filed Sep. 8, 2014, 49 pages.

* cited by examiner

*Primary Examiner* — Thong Q Le
(74) *Attorney, Agent, or Firm* — Toler Law Group, PC (57) ABSTRACT

A data storage device includes a resistive random access memory (ReRAM) having a three-dimensional (3D) memory configuration that is monolithically formed in one or more physical levels of arrays of memory cells having an active area disposed above a silicon substrate. The data storage device further includes circuitry associated with operation of the memory cells. A method includes performing a first number of write operations to the ReRAM. The method further includes incrementing a value of a counter a second number of times in response to performing at least one of the write operations. The second number is less than the first number.

20 Claims, 7 Drawing Sheets

COUNTER FOR WRITE OPERATIONS AT A DATA STORAGE DEVICE

FIELD OF THE DISCLOSURE

The present disclosure is generally related to data storage devices.

BACKGROUND

Non-volatile data storage devices have enabled increased portability of data and software applications. For example, multi-level cell (MLC) storage elements of a memory device may each store multiple bits of data, enhancing data storage density as compared to single-level cell (SLC) memory devices. As another example, a memory device with a three-dimensional (3D) memory configuration may include multiple layers of storage elements, thus increasing data storage density compared to a two-dimensional (2D) (or "planar") memory device. Consequently, memory devices enable users to store and access a large amount of data.

A flash memory device may be associated with a write endurance, such as a number of program/erase (P/E) cycles that can be performed at storage elements of the memory device without impairing reliability of the storage elements. For example, after a large number of P/E cycles at a flash memory device, stored data may become unreliable due to physical wear associated with the programming and erase operations. As a result, a flash memory device may count P/E cycles for each block of the flash memory device so that wear is "distributed" approximately evenly among the blocks.

In a flash memory device, a single erase operation may erase data in a large number of storage elements. For example, a single erase operation may erase data from each storage element of each word line of a block of the flash memory device. Thus, P/E cycles may be tracked efficiently at a flash memory device by counting erase operations (e.g., based on a count of erased blocks). Other memory devices may operate differently than a flash memory device. For example, certain resistance-based memory devices may enable programming and/or erasure of individual storage elements (instead of groups of storage elements, such as blocks). In this case, counting P/E cycles of each individual storage element may be commercially infeasible, particularly for high density data storage devices.

SUMMARY

A data storage device may include a resistive random access memory (ReRAM) and a controller that writes data to the ReRAM. Instead of counting each individual write operation to the ReRAM, the controller may count write operations that write data having larger data sizes to the ReRAM more often than counting write operations that write data with smaller data sizes to the ReRAM. To illustrate, the controller may utilize a statistical technique in which a write operation that writes a large amount of data to the ReRAM is more likely to cause the controller to increment the value of the counter as compared to a write operation that writes a smaller amount of data to the ReRAM. As a result, the value of the counter may indicate (or approximately indicate) a number of program/erase (P/E) cycles while avoiding tracking programming and erase operations of each individual storage element of the ReRAM. The data storage device may utilize the counter in connection with a wear leveling process. For example, the counter may be associated with a particular storage region of the ReRAM, and the data storage device may initiate wear leveling at the ReRAM in response to the value of the counter indicating a large number of P/E cycles, such as by relocating data stored at the particular storage region to another storage region of the ReRAM. Relocating the data may avoid physical damage and data loss at the data storage device that can be caused by repeatedly initiating write operations at the particular storage region to modify the data.

DETAILED DESCRIPTION

Figure 1:
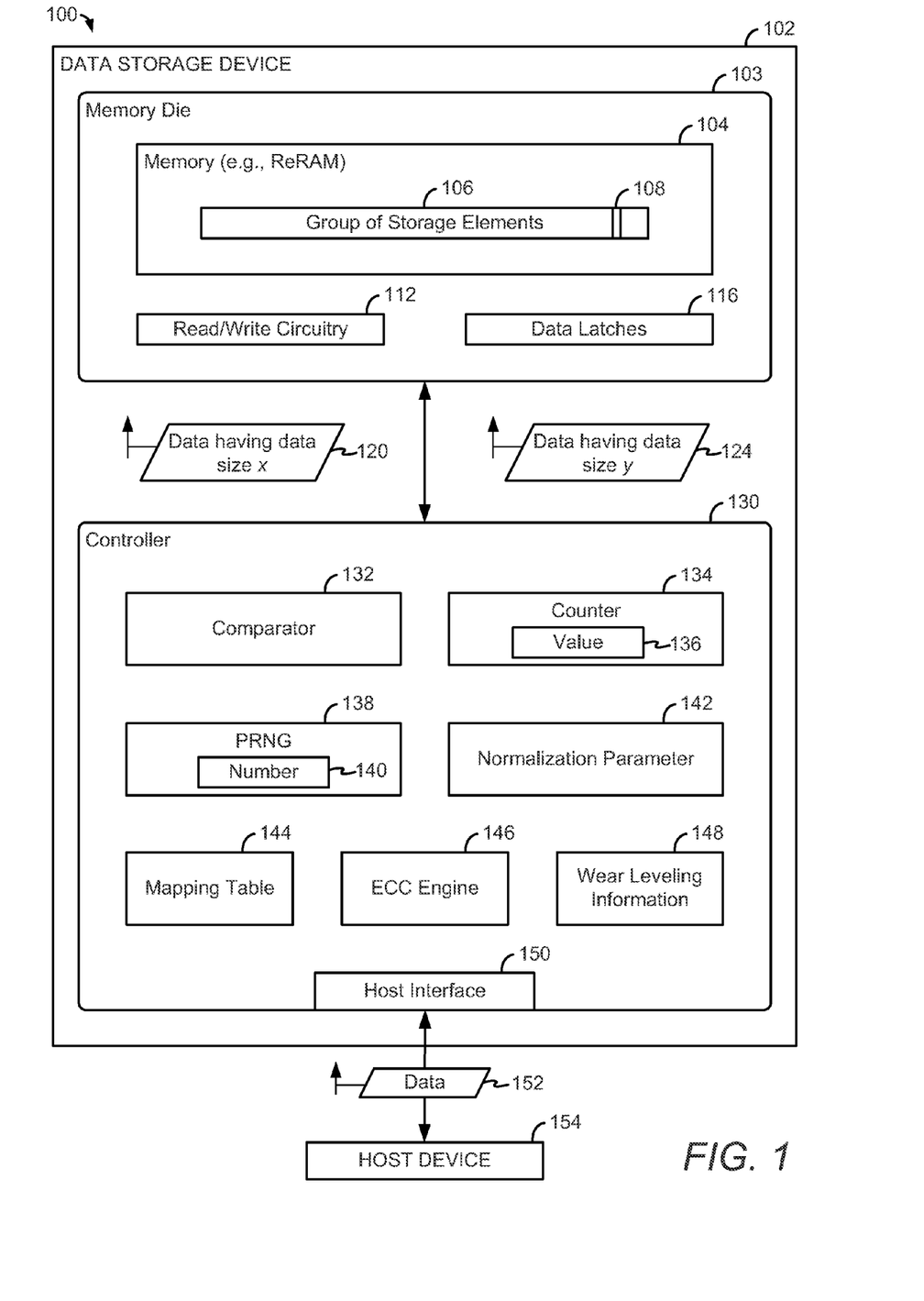
FIG. 1 is a block diagram of a particular illustrative embodiment of a system that includes a data storage device.

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 includes a memory die 103 (e.g., an integrated circuit) and a controller 130. The memory die 103 and the controller 130 may be coupled via one or more buses or other structures.

The memory die 103 includes a memory 104 (e.g., a memory array), read/write circuitry 112, and data latches 116. The memory 104 may include a non-volatile memory, such as a resistive random access memory (ReRAM). The memory 104 is operationally coupled to the controller 130. The memory 104 may have a three-dimensional (3D) memory configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration.

The memory 104 may include one or more groups of storage elements, such as a representative group of storage elements 106. The group of storage elements 106 may include multiple storage elements (e.g., memory cells), such as a representative storage element 108.

The controller 130 may include a comparator 132, a counter 134, a pseudo-random number generator (PRNG) 138, an error correcting code (ECC) engine 146, and a host interface 150. The controller 130 may be configured to store a normalization parameter 142, a mapping table 144, and wear leveling information 148. The counter 134 may be configured to store a value 136, and the PRNG 138 may be configured to generate a number 140.

The counter 134 may be associated with a particular storage region of the memory 104. In a particular embodiment, the particular storage region corresponds to (or includes) the group of storage elements 106. To illustrate, depending on the particular implementation, the counter 134 may be associated with a particular word line of the memory 104, and the controller 130 may include a dedicated counter for each word line of the memory 104. In other implementations, the counter 134 may be associated with a set of word lines (e.g., an erase block) of the memory 104, and the controller 130 may include a dedicated counter for each set of word lines (e.g., each erase block) of the memory 104.

The PRNG 138 may be configured to generate binary numbers that have either a "0" value or a "1" value with particular probabilities. To illustrate, the number 140 may have a "1" value with a first probability (e.g., a probability of 0.6, as an illustrative example) and may have a "0" value with a second probability (e.g., a probability of 0.4, as an illustrative example).

The ECC engine 146 is configured to receive data and to generate one or more ECC codewords based on the data. The ECC engine 146 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The ECC engine 146 is further configured to decode data accessed from the memory 104. For example, the ECC engine 146 may be configured to decode data accessed from the memory 104 to detect and correct one or more errors that may be present in the data, up to an error correcting capacity of the particular ECC scheme. The ECC engine 146 may include a Hamming decoder, an RS decoder, a BCH decoder, an LDPC decoder, a turbo decoder, a decoder configured to decode data according to one or more other ECC schemes, or a combination thereof.

The controller 130 is configured to receive data and instructions from the host device 154 and to send data to the host device 154. For example, the controller 130 may receive data from the host device 154 via the host interface 150 in connection with a request for write access to the memory 104 received from the host device 154. As another example, the controller 130 may send data to the host device 154 via the host interface 150 in connection with a request for read access to the memory 104 received from the host device 154.

The controller 130 is configured to send data and commands to the memory 104 and to receive data from the memory 104. For example, the controller 130 is configured to send data and a write command to cause the memory 104 to store the data to a specified address of the memory 104. The write command may specify a physical address of a portion of the memory 104 (e.g., a physical address associated with the group of storage elements 106) that is to store the data. The controller 130 is configured to send a read command to the memory 104 to access data from a specified address of the memory 104. The read command may specify the physical address of a portion of the memory 104 (e.g., a physical address associated with the group of storage elements 106).

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

In operation, the controller 130 may receive data 152 and a request for write access to the memory 104 from the host device 154 via the host interface 150. The data 152 may correspond to a user data file (e.g., an image file, an audio file, or a video file, as illustrative examples). The controller 130 may input the data 152 to the ECC engine 146 to generate one or more ECC codewords based on the data 152. For example, the ECC engine 146 may generate data 120. The controller 130 may initiate a write operation to write the data 120 to the memory 104 (e.g., to the group of storage elements 106). Initiating a write operation may include mapping one or more logical addresses associated with the data 152 to one or more physical addresses of the memory 104 (e.g., using a logical-to-physical mapping table that may be stored at the controller 130).

The data 120 may have a data size x (where x indicates a positive integer). The data size x may indicate a number of bits of the data 120, a number of bytes of the data 120, or a number of storage elements of the memory 104 targeted by the write operation, as illustrative examples. In a particular embodiment, the data size x is indicated in a header field of the data 120.

The controller 130 may access the mapping table 144 to identify a counter associated with the data 120. For example, the mapping table 144 may identify multiple addresses (e.g., physical addresses of the memory 104) and counters associated with the multiple addresses. In the example of FIG. 1, the counter 134 may be associated with a particular storage region at which the data 120 is to be written. In an illustrative example, the data 120 is to be written the group of storage elements 106, and the controller 130 is configured to access the mapping table 144 to determine that the counter 134 is associated with one or more physical addresses associated with the group of storage elements 106.

The controller 130 may be configured to determine whether to increment the value 136 of the counter 134 based on the data size x of the data 120. For example, if the data size x satisfies a data size threshold, the controller 130 may increment the value 136 of the counter 134. In a particular embodiment, the data size threshold is indicated by the normalization parameter 142. The data size threshold may correspond to a data block size of data blocks written to the memory 104. To illustrate, in certain ReRAM configurations, data may be written to the memory 104 in "chunks" (or data blocks) of a particular data size, such as 64 kilobytes (kB), as an illustrative, non-limiting example. In this case, the particular data size may correspond to a maximum data size that can be bused to the memory 104 in a particular time interval, as an illustrative example. In another implementation, the particular data size may correspond to a physical storage size of a region of the memory 104, such as a physical storage size of the group of storage elements 106. In another illustrative example, the particular data size may correspond to a length of ECC codewords generated by the ECC engine 146.

In an illustrative implementation, the PRNG 138 is configured to generate a number, such as the number 140, having a particular value (e.g., a "1" value) with a probability that corresponds to the data size x (e.g., a larger value of x may correspond to a larger probability that a "1" value is generated). The controller 130 may increment the value 136 of the counter 134 in response to the number 140 having the particular value. For example, the comparator 132 may be configured to compare the number 140 with a reference number, such as a reference "0" value or a reference "1" value.

To illustrate, the controller 130 may divide the data size x by the normalization parameter 142 to generate a ratio. The number 140 may have a "1" value with a probability corresponding to the ratio. Thus, the number 140 may be more likely to have a "1" value for a greater value of the data size x. In a particular embodiment, the size x and the normalization parameter 142 each correspond to a data size of data blocks written to the memory 104. In this case, the ratio may be equal (or approximately equal) to one, and the probability of the number 140 having a "1" value may be equal (or approximately equal) to one.

In other cases, data written to the memory 104 may have another (e.g., smaller) data size. To illustrate, the controller 130 may initiate a write operation to write data 124 to the memory 104, and the data 124 may have a data size y (where y indicates a positive integer that is less than x. The data size y may be indicated in a header field of the data 124.

In a particular embodiment, the memory 104 has configuration that facilitates modification of individual storage elements (e.g., without erasing and rewriting an entire word line that includes the individual storage elements). For example, in an illustrative ReRAM configuration, a value stored by the storage element 108 may be changed (e.g., from a "0" state to a "1" state, or vice versa) without changing values stored by other storage elements of the group of storage elements 106. In this case, the data 124 may correspond to a single value to be programmed to the storage element 108 (e.g., to correct a data error of a value stored at the storage element 108). Alternatively, the data 124 may include multiple values to be programmed to multiple storage elements of the memory 104. For example, if a data size of the data 152 exceeds a data block size of data blocks written to the memory 104, the data 124 may correspond to the "extra" data that exceeds the data block size (or that does not "fit" in the data 120).

The controller 130 may access the mapping table 144 to identify a counter associated with the data 124. In the example of FIG. 1, the counter 134 may be associated with a particular storage region at which the data 124 is to be written. For example, if the data 124 corresponds to a modification of the data 120 stored at the group of storage elements 106, the controller 130 may access the mapping table 144 to determine that the counter 134 is associated with one or more physical addresses associated with the group of storage elements 106.

The controller 130 may be configured to determine whether to increment the value 136 of the counter 134 based on the data size y of the data 124. In an illustrative implementation, the PRNG 138 is configured to generate a number, such as the number 140, having a particular value (e.g., a "1" value) with a probability that corresponds to the data size y. The controller 130 may increment the value 136 of the counter 134 in response to the number 140 having the particular value. For example, the counter 134 may be responsive to the comparator 132, and the comparator 132 may be configured to compare the number 140 to a reference number to determine whether the number 140 corresponds to the particular value.

To illustrate, the controller 130 may divide the data size y by the normalization parameter 142 to generate a reference number (e.g., a ratio). The number 140 may have a "1" value with a probability corresponding to the ratio. Thus, the number 140 may be less likely to have a "1" value for a smaller value of the data size y. As an illustrative example, if the data 124 corresponds to a single value to be written (or rewritten) at the memory 104, then the ratio may be small. In this case, the ratio may be equal (or approximately equal) to zero, and the probability of the number 140 having a "1" value may be equal (or approximately equal) to zero.

In one or more other implementations, the controller 130 may be configured to access a lookup table to determine a reference number. For example, the controller 130 may store a lookup table indicating data sizes (or ranges of data sizes) and a set of reference numbers. The set of reference numbers may include a range of reference numbers having values each greater than zero and each less than one (e.g., 0.1, 0.2, 0.3, etc.). The controller 130 may access the lookup table based on a particular data size (e.g., x or y) to determine a particular reference number associated with the particular data size. The number 140 may be generated with a probability of having a "1" value corresponding to the reference number (e.g., with a probability of 0.5, as an illustrative example). In this example, use of the lookup table may enable the controller 130 to avoid performing a division operation to generate the ratio, which may improve performance of the controller 130 in some cases.

Accordingly, the controller 130 may selectively update the value 136 of the counter 134 based on a first number of write operations. The write operations may include a write operation that writes the data 120 to the memory 104 and a write operation that writes the data 124 to the memory 104. In response to performing at least one of the write operations, the controller 130 may increment the value 136 of the counter 134 a second number of times, where the second number is less than the first number. For example, in the example of FIG. 1, the controller 130 may increment the value 136 in response to writing the data 120 but not in response to writing the data 124, such as when the number 140 generated for the data 120 has a "1" value but the number 140 generated for the data 124 has a "0" value. In this illustrative example, the first number is equal to two, and the second number is equal to one.

The controller 130 may use the value 136 in connection with wear leveling operations at the memory 104. To illustrate, the value 136 of the counter 134 may be associated with a particular storage region of the memory 104, such as the group of storage elements 106, which may store the data 120. In this example, the value 136 indicates an approximate number of P/E cycles associated with the storage region of the memory 104 that stores the data 120. The controller 130 may be configured to determine whether the value 136 satisfies a P/E threshold. To illustrate, in some cases, the data 120 may be subject to a large number of modifications, such as if a user of the host device 154 often modifies the data 120. In this case, the value 136 may be large. If the value 136 satisfies the P/E threshold, the controller 130 may initiate a wear leveling process at the memory 104. For example, the controller 130 may access the wear leveling information 148 to determine another storage region of the memory 104 at which to relocate the data 120, such as a region that has not been subject to a large number of P/E cycles (which may be indicated by another counter of the controller 130). In this example, the controller 130 may copy the data 120 from the group of storage elements 106 to the other storage region to "level" wear that occurs at the memory 104 due to P/E cycles. In certain implementations, the controller 130 may update the wear leveling information 148 to indicate that the group of storage elements 106 should not be used for additional write operations (e.g., to "close" the group of storage elements 106 to further write operations in response to a large number of P/E cycles at the group of storage elements 106).

The example of FIG. 1 illustrates that the value 136 can be selectively updated to statistically indicate a number of program/erase (P/E) cycles. To illustrate, certain memory configurations that enable programming of individual storage elements (e.g., instead of requiring erasure and programming of an entire group of storage elements, such as a word line). In such configurations, precisely tracking a number of P/E cycles may be infeasible. For example, tracking a number of P/E cycles for each storage element of the memory 104 may be infeasible. By selectively incrementing the value 136 of the counter 134 based on data sizes of data written to the group of storage elements 106, the value 136 is statistically expected to approximate a number of P/E cycles at the group of storage elements 106. The controller 130 may utilize the value 136 in connection with wear leveling operations at the memory 104, which may avoid data corruption associated with storing data at a storage region associated with a large number of P/E cycles.

Figure 2:
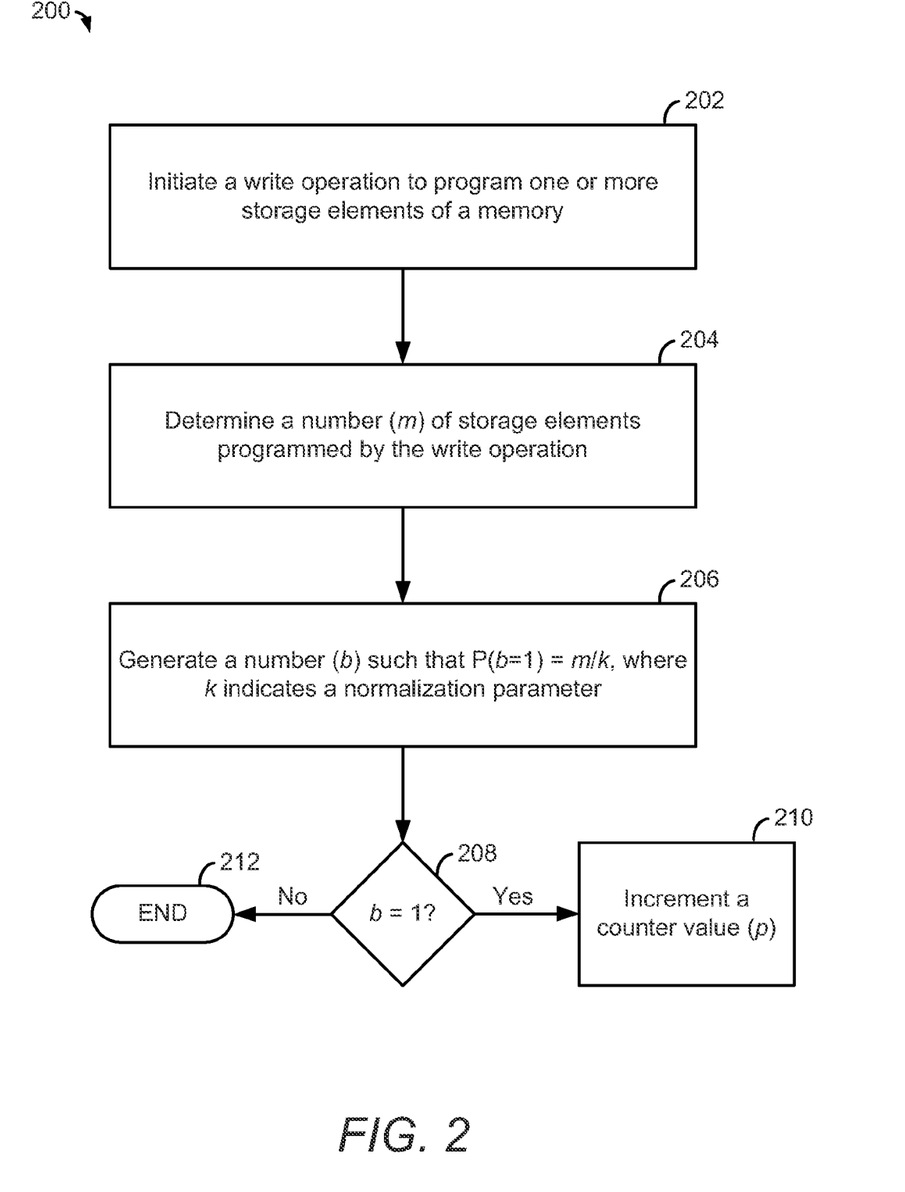
FIG. 2 is a flow diagram of an illustrative method of operation of the data storage device of FIG. 1.

Referring to FIG. 2, an illustrative example of a method is depicted and generally designated 200. The method 200 may be performed at a data storage device, such as the data storage device 102 of FIG. 1. For example, the controller 130 of FIG. 1 may be configured to perform the method 200.

The method 200 includes initiating a write operation to program one or more storage elements of a memory, at 202. The memory may correspond to the memory 104 of FIG. 1, and the one or more storage elements may correspond to the group of storage elements 106 of FIG. 1 (or a subset thereof). The write operation may include writing the data 120 or the data 124 to the memory 104.

The method 200 further includes determining a number (m) of storage elements programmed by the write operation, at 204. To illustrate, m may correspond to the data size x of the data 120 or the data size y of the data 124. In a particular embodiment, the controller 130 is configured to parse a header field (or other information) of data to be programmed at the memory 104 to determine the number of storage elements programmed by the write operation.

The method 200 further includes generating a number (b) (e.g., the number 140), at 206. The number (b) may be generated with a probability of having a "1" value (P(b=1)) that is based on the number of storage elements (m) and a normalization parameter (k) (e.g., the normalization parameter 142 of FIG. 1). In a particular embodiment, the controller 130 is configured to determine a ratio m/k, and P(b=1)=m/k. In this example, the PRNG 138 may be responsive to an indication of the ratio m/k, and the PRNG 138 may be configured to generate the number (b) based on the ratio m/k.

The method 200 further includes determining whether the number (b) is equal to one, at 208. For example, the comparator 132 may be configured to compare the number (b) to a reference value to determine whether the number (b) is equal to one.

If the number (b) is equal to one, the method 200 may further include incrementing a counter value (p), at 210. The counter value (p) may correspond to the value 136 of the counter 134 of FIG. 1. If the number (b) is not equal to one, the method 200 may end, at 212. For example, if the number (b) is equal to zero, the method 200 may terminate without incrementing the counter value (p).

The method 200 of FIG. 2 may enable efficient tracking of approximate program/erase (P/E) cycles at a data storage device. For example, because P(b=1) is larger for a greater value of m in the example of FIG. 2, write operations targeting a larger number of storage elements (e.g., a number approximately equal to a data block size) are more likely to result in incrementing of the counter value (p). Write operations targeting a smaller number of storage elements (e.g., a number much less than the data block size) are less likely to result in incrementing of the counter value (p). Thus, the counter value (p) is statistically expected to approximate a number of P/E cycles while avoiding incrementing a counter with each write operation.

Figure 3:
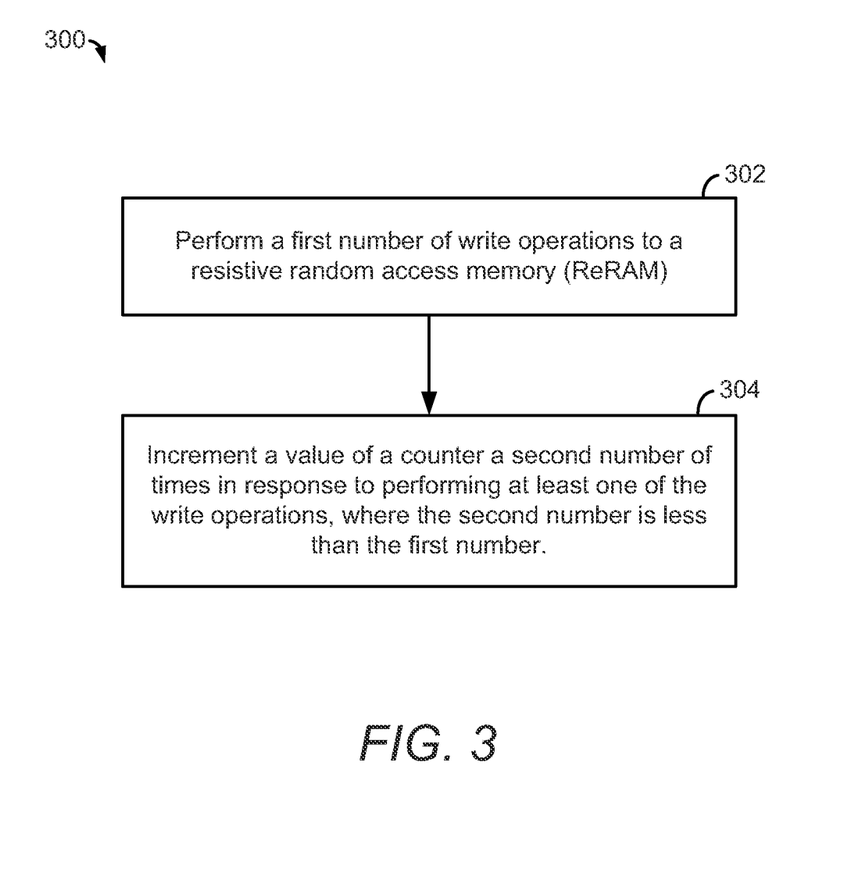
FIG. 3 is a flow diagram of another illustrative method of operation of the data storage device of FIG. 1.

Referring to FIG. 3, an illustrative example of a method is depicted and generally designated 300. The method 300 may be performed at a data storage device, such as the data storage device 102. The data storage device may include a ReRAM having a 3D memory configuration that is monolithically formed in one or more physical levels of arrays of memory cells having an active area disposed above a silicon substrate, such as described in further detail with reference to FIG. 7. The ReRAM may correspond to the memory 104, and the memory cells may correspond to the group of storage elements 106. The data storage device may further include circuitry associated with operation of the memory cells, such as the read/write circuitry 112 and/or the data latches 116, as illustrative examples.

The method 300 may include performing a first number of write operations to the ReRAM, at 302. The write operations may include a first write operation to write the data 120 to the memory 104 and a second write operation to write the data 124 to the memory 104, as illustrative examples. In this case, the first number is equal to two. Alternatively, the first number may be equal to another positive integer.

The method 300 may further include incrementing a value of a counter a second number of times in response to performing at least one of the write operations, at 304. The second number is less than the first number. The value may correspond to the value 136, and the counter may correspond to the counter 134. To further illustrate, the value 136 of the counter 134 may be incremented in response to the write operation that writes the data 120 to the memory 104. In this illustrative example, the value 136 of the counter 134 may not be incremented in response to the write operation that writes the data 124 to the memory 104. In this case, the first number is equal to two, and the second number is equal to one. Alternatively, the first number and the second number may correspond to different numbers.

The method 300 may optionally include determining a ratio between a number of cells associated with data written by (or "targeted by") a first write operation of the write operations and a normalization parameter. To illustrate, the normalization parameter may correspond to the normalization parameter 142 of FIG. 1 and/or the normalization parameter k of FIG. 2. In a particular embodiment, the first write operation writes the data 120 to the memory 104. In this example, the number of cells targeted by the first write operation may correspond to the data size x (or may be determined based on the data size x). To further illustrate, the normalization parameter may correspond to a data block size of data blocks written to the memory 104, and the first write operation may write a first data block having the data block size to the memory 104. The first data block may correspond to the data 120. In this particular example, the first write operation may be included in a subset of the write operations (e.g., a write operation that writes the data 120 to the memory 104).

The write operations may further include a second write operation that is included in a second subset of the write operations, and the second write operation may write second data to the ReRAM having a data size that is less than the data block size. For example, the second data may correspond to the data 124, and the data size may correspond to the data size y. In a particular embodiment, the second data corresponds to an update of the first data block, such as by modifying one or more values of the first data block. For example, the data 124 may correspond to a modification (e.g., overwrite) of a value stored at the storage element 108. To illustrate, if the ECC engine 146 determines during a decoding process associated with the data 120 that the value stored by the storage element 108 is "incorrect" (e.g., corrupted), the data 124 may be written to the memory 104 to reprogram (or "correct") the value, as a non-limiting example. Alternatively, the second data may correspond to other data, such as a second data block having the data block size.

The method 300 may optionally include, for each of the write operations, determining a number, such that a probability of the number being equal to one corresponds to the ratio. For example, the number 140 may be generated by the PRNG 138. The value 136 of the counter 134 may be incremented each time the number 140 is equal to one, which may be determined by the comparator 132.

The value 136 may approximate a number of program/erase (P/E) cycles. The number of P/E cycles may enable wear leveling at a data storage device, which may avoid data loss that can occur due to physical wear at a memory. Depending on the particular implementation, the number of P/E cycles may be associated with a particular storage region of the memory 104, such as the group of storage elements 106. Further, the memory 104 may include multiple storage regions, and the controller 130 may separately track approximate numbers of P/E cycles for each of the multiple storage regions using the method 300 of FIG. 3. For example, as described further with reference to FIGS. 4-5, multiple counters may be maintained for multiple storage regions of a memory.

Figure 4:
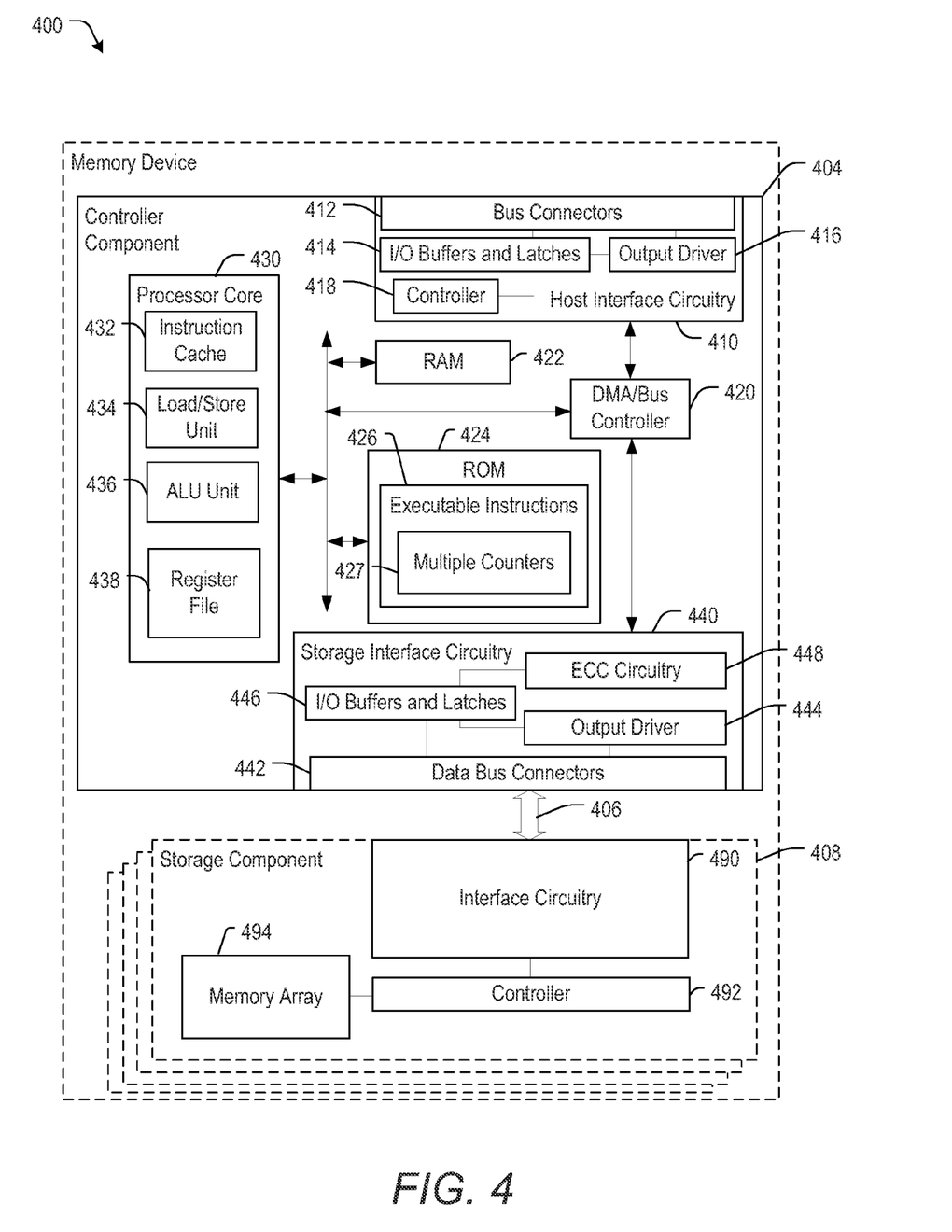
FIG. 4 is a block diagram of a particular embodiment of a memory device that may be included in the data storage device of FIG. 1.

Referring to FIG. 4, an illustrative example of a memory device is depicted and generally designated 400. The memory device 400 includes a controller component 404 coupled to one or more storage components, such as a representative storage component 408, via a bus 406. The representative storage component 408 includes interface circuitry 490 to communicate via the bus 406. The storage component 408 also includes a controller 492 that is coupled to the interface circuitry 490 and that is also coupled to a memory, such as a memory array 494. The memory array 494 may include one or more types of storage media, such as a NAND flash array or a ReRAM array. The memory array 494 may have a 3D memory configuration. Alternatively, the memory array 494 may have another configuration, such as a 2D memory configuration. The memory device 400 may correspond to the data storage device 102 of FIG. 1.

In a particular embodiment, the controller component 404 includes host interface circuitry 410 coupled to a direct memory access (DMA)/bus controller 420. The controller component 404 also includes storage interface circuitry 440 that is coupled to the DMA/bus controller 420. A processor core 430, a random access memory (RAM) 422 and a read-only memory (ROM) 424 are coupled to the DMA/bus controller 420 via an internal bus.

In a particular embodiment, the host interface circuitry 410 includes bus connectors 412 coupled to input/output (I/O) buffers and latches 414. The bus connectors 412 are further coupled to output driver circuitry 416. The host interface circuitry 410 also includes a controller 418. In a particular embodiment, the host interface circuitry 410 operates in accordance with a universal serial bus (USB) protocol. For example, the controller 418 may be programmed to receive USB protocol instructions and data from a host device (not shown) via the bus connectors 412 that are coupled to a universal serial bus. The controller 418 may include a hardware processor that executes instructions stored at an internal memory, such as a read-only memory (not shown) to enable receipt and acknowledgment of USB instructions and data. Alternatively, or in addition, the host interface circuitry 410 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 430 includes an instruction cache 432, a load/store unit 434, an arithmetic logic unit (ALU) unit 436, and a register file 438. The processor core 430 may include, or may function substantially similarly to, an ARM core, as an illustrative, non-limiting example. For example, the processor core 430 may support a reduced instruction set computer (RISC) microarchitecture. The processor core 430 may be configured to retrieve data and executable instructions 426 via the load/store unit 434 from the ROM 424. The executable instructions 426 may be executable by the processor core 430 to perform one or more operations described herein.

For example, the executable instructions 426 may indicate multiple counters 427 (e.g., counters implemented in firmware) and may include instructions executable by the processor core 430 to maintain values of the multiple counters 427. The multiple counters 427 may include a counter corresponding to the counter 134 of FIG. 1. Each of the multiple counters 427 may correspond to a respective storage region of the memory array 494. For example, each of the multiple counters 427 may indicate an approximate number of P/E cycles associated with one or more word lines of the memory array 494. The executable instructions 426 may indicate a mapping table, such as the mapping table 144 of FIG. 1, which may associate each of the multiple counters 427 with a corresponding storage region of the memory array 494. In a particular embodiment, the controller 130 of FIG. 1 includes the multiple counters 427, and the multiple counters 427 are associated with multiple storage regions of the memory 104.

Alternatively, or in addition, at least some of the executable instructions 426 may not be stored at the ROM 424 and may be stored at the memory array 494. The executable instructions 426 may be retrieved from the memory array 494 and stored at the RAM 422. The processor core 430 may be configured to retrieve the executable instructions 426 from the RAM 422 for execution.

The executable instructions 426 may be retrieved by the load/store unit 434 and stored to the instruction cache 432. The ALU unit 436 may include dedicated circuitry to perform arithmetic and logic operations, such as addition and subtraction, AND, NOT, OR, exclusive-OR (XOR), other arithmetic or logic operations, or any combination thereof. It should be appreciated that the storage component 408 may include logic gates and/or an ALU unit (not shown) configured to perform arithmetic logic operations.

The register file 438 may include multiple memory cells that may provide high speed access to the processor core 430 of data to be used for execution of instructions. One or more memory cells at the register file 438 may be dedicated to store a status indicator. Additional data values, such as values to indicate memory type, memory write status, and write protect status, may also be set during execution of the executable instructions 426 at the processor core 430.

The storage interface circuitry 440 may include data bus connectors 442, an output driver 444, input/output buffers and latches 446, and ECC circuitry 448. The data bus connectors 442 may include electrical connectors to enable electrical signal propagation via the bus 406. The I/O buffers and latches 446 may be configured to store data that is received via the DMA/bus controller 420 to be transmitted via the bus 406 using electrical signals at the data bus connectors 442 that are generated by the output driver 444. In addition, or alternatively, the I/O buffers and latches 446 may store data values represented by electrical signals received at the data bus connectors 442 via the bus 406, such as signals generated by the interface circuitry 490 of the storage component 408.

The ECC circuitry 448 may correspond to the ECC engine 146 of FIG. 1. The ECC circuitry 448 may include dedicated hardware and circuitry configured to perform operations using data and error correcting code information corresponding to the data that are received as a result of a memory read from the storage component 408, and may perform logical or arithmetic operations to verify that the received data is not detected to have corrupted values. For example, the received data may include additional bits representing an error correcting code, which may be encoded based on values of the data upon storage at the memory array 494. Corruption of one or more bits of the data, or one or more bits of the error correcting code, may be detectable by the ECC circuitry 448. For example, the storage interface circuitry 440 may include a flash memory interface, and the ECC circuitry 448 may be compliant with one or more flash error correcting code protocols.

Figure 5:
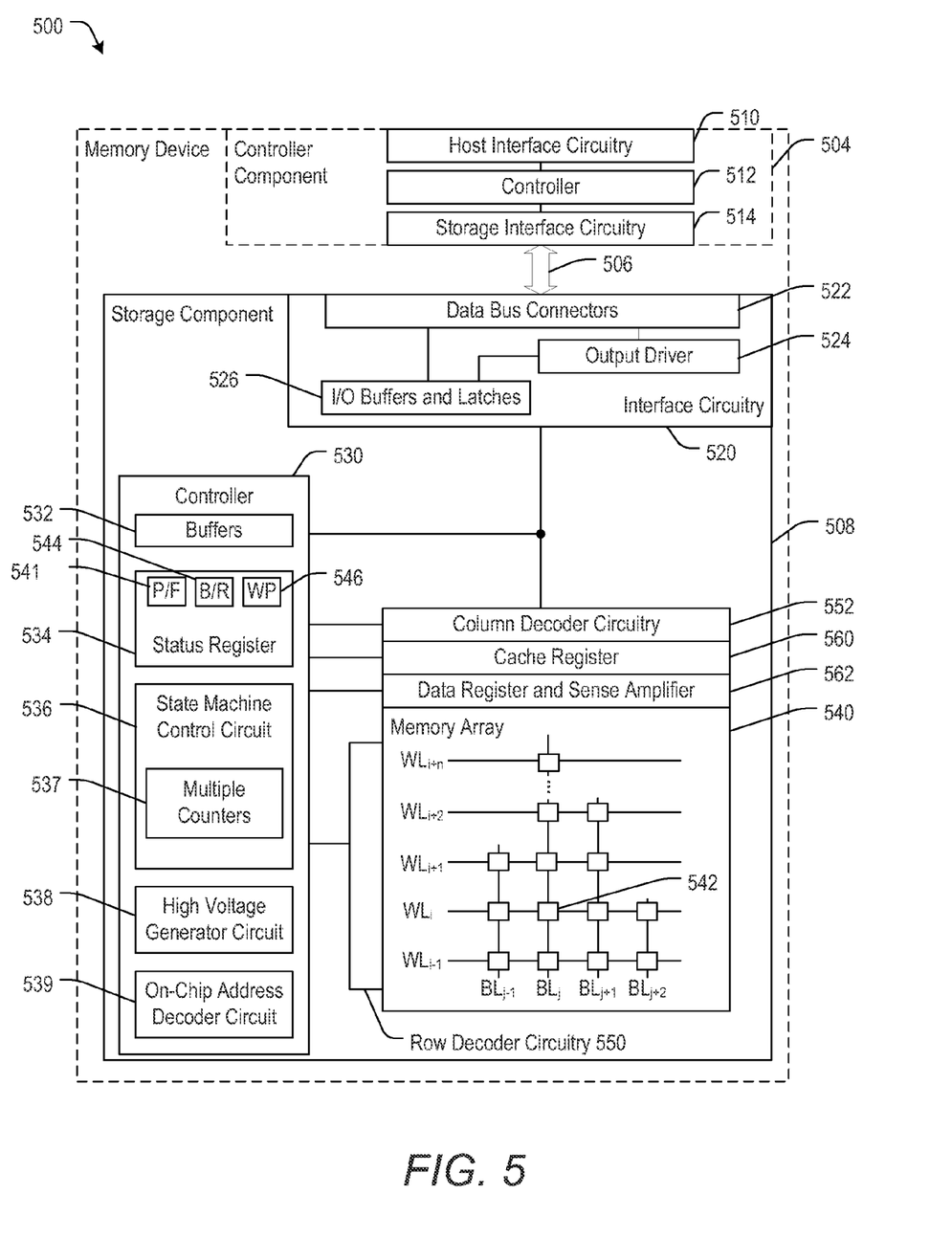
FIG. 5 is a block diagram of another particular embodiment of a memory device that may be included in the data storage device of FIG. 1.

Referring to FIG. 5, an illustrative embodiment of a memory device is depicted and generally designated 500. The memory device 500 includes a controller component 504 coupled to a storage component 508. The memory device 500 may correspond to the data storage device 102 of FIG. 1. For example, the controller component 504 may correspond to the controller 130 of FIG. 1, and the storage component 508 may correspond to the memory 104 of FIG. 1. The storage component 508 may have a 3D memory configuration. Alternatively, the storage component 508 may have another configuration, such as a 2D memory configuration.

The controller component 504 may include host interface circuitry 510, a controller 512, and storage interface circuitry 514. The controller component 504 may be coupled to the storage component 508 via a data bus 506, such as an 8-bit or 16-bit parallel data bus, as an illustrative, non-limiting example. The controller component 504 may communicate instructions and data with an external host (not shown) via the host interface circuitry 510. The controller 512 may be configured to respond to instructions received by the host interface circuitry 510 and may also be configured to send and receive data and instructions to the storage component 508 via the storage interface circuitry 514.

In a particular embodiment, the storage component 508 includes interface circuitry 520, a controller 530 coupled to the interface circuitry 520, and a memory array 540 accessible to the controller 530. The storage component 508 may include one or more sets of row decoder circuitry, such as row decoder circuitry 550. The storage component may further include column decoder circuitry 552. The row decoder circuitry 550 and the column decoder circuitry 552 may enable access to data stored at one or more particular rows and particular columns of the memory array 540, such as to read a value from or to write a value to a particular memory cell 542 at a bit line $BL_j$ and at word line $WL_i$. A cache register 560 and a data register and sense amplifier 562 may further be coupled to the memory array 540 and may be used to cache or to temporarily store data that is to be written to the memory array 540 or data that has been read out of the memory array 540. In a particular embodiment, the memory array 540 may include a flash memory or a ReRAM. The memory array 540 may have a 3D memory configuration.

In a particular embodiment, the controller 530 includes one or more buffers 532 to store instructions, data, or any combination thereof. The controller 530 may also include one or more status registers 534, a state machine control circuit 536, a high voltage generator circuit 538, and an on-chip address decoder circuit 539.

The controller 530 may be coupled to provide electrical signals to the row decoder circuitry 550, to the column decoder circuitry 552, to the cache register 560, and to the data register and sense amplifier 562. In a particular embodiment, the controller 530, including one or more of the buffers 532, the status register 534, the state machine control circuit 536, the high-voltage generation circuit 538, and the on-chip address decoder circuit 539, in conjunction with the interface circuitry 520 and the memory array 540, may be configured to perform one or more operations described with reference to the method 300 of FIG. 3. Alternatively or in addition, the controller 512 may be configured to perform one or more operations of the method 300 of FIG. 3.

In a particular embodiment, the status register 534 of the controller 530 may include one or more indicators storing values, such as a pass/fail (P/F) value 541, a busy/ready (B/R) value 544, a write protect (WP) value 546, one or more other indicators, or a combination thereof. The status register 534 may be accessible to the state machine control circuit 536.

The state machine control circuit 536 may include dedicated hardware and circuitry to control an operation of the controller 530 in response to one or more received instructions and internal states, such as may be represented at the status register 534. The state machine control circuit 536 may include states such as a read status state, a data write state, a data read state, as illustrative, non-limiting examples.

In the example of FIG. 5, the state machine control circuit 536 includes multiple counters 537. The multiple counters 537 may be configured to store values indicating approximate numbers of P/E cycles associated with particular storage regions of the memory array 540, such as particular word lines and/or bit lines. The multiple counters 537 may include the counter 134 of FIG. 1.

In a particular embodiment, the high voltage generator circuit 538 may be responsive to the state machine control circuit 536 and may be configured to generate a high voltage to program values to, or erase values from, the memory array 540. For example, the memory array 540 may be a flash memory or other memory that may be programmable or erasable via a "high" voltage, such as, for example, five volts (V). Alternatively, the memory array 540 may include a ReRAM. The memory array 540 may have a 3D memory configuration, such as a vertical 3D memory configuration (e.g., a vertical 3D NAND flash memory configuration). The controller 530 may also include the on-chip address decoder circuit 539 that may include hardware and logic circuitry to receive memory address information from the controller component 504 and to decode the memory address information to specific rows and columns to be provided to the row decoder circuitry 550 and the column decoder circuitry 552.

The interface circuitry 520 may include data bus connectors 522, an output driver 524 coupled to the data bus connectors 522, and input/output (I/O) buffers and latches 526. The I/O buffers and latches 526 may be configured to store or to latch data that is received via the data bus connectors 522 or data that is to be written to the data bus 506 via the data bus connectors 522. The data bus connector 522 may include physical electrical connectors that couple the interface circuitry 520 to the data bus 506. The output driver 524 may include dedicated circuitry and electrical connections to enable the interface circuitry 520 to drive electrical signals over the data bus 506. In a particular embodiment, the interface circuitry 520 is configured to comply with one or more bus communications protocols or standards.

Figure 6:
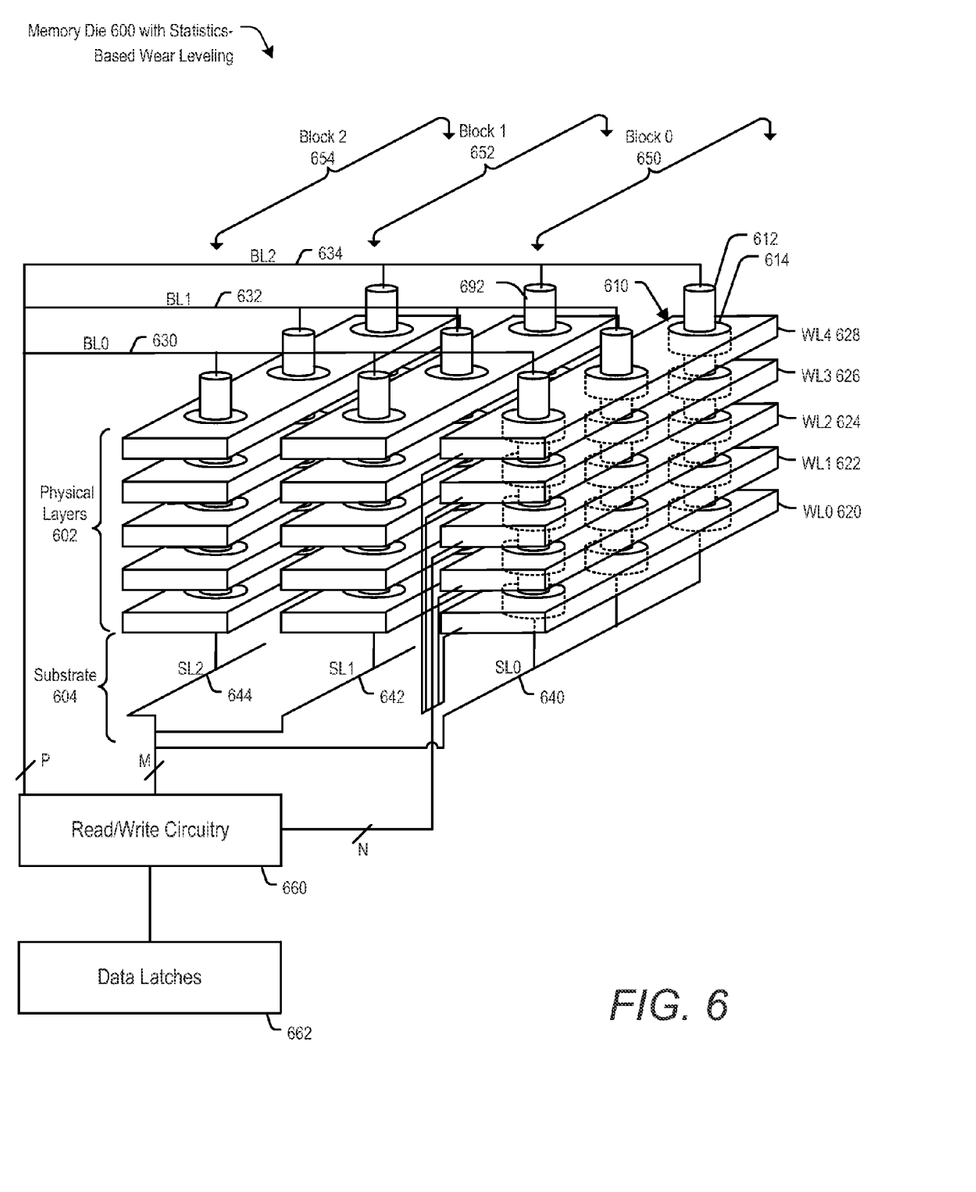
FIG. 6 is a block diagram of a particular embodiment of a memory die that may be included in the data storage device of FIG. 1.

FIG. 6 illustrates an embodiment of a memory die 600 in a NAND flash configuration. Operation of the memory die 600 may include statistics-based wear leveling, which may be initiated by the controller 130 of FIG. 1. The memory die 600 may be included in the data storage device 102 of FIG. 1. For example, the memory die 600 may correspond to the memory die 103 of FIG. 1.

The memory die 600 includes multiple physical layers, such as a group of physical layers 602. The multiple physical layers are monolithically formed above a substrate 604, such as a silicon substrate. Storage elements (e.g., memory cells), such as a representative memory cell 610, are arranged in arrays in the physical layers.

The representative memory cell 610 includes a charge trap structure 614 between a word line/control gate (WL4) 628 and a conductive channel 612. Charge may be injected into or drained from the charge trap structure 614 via biasing of the conductive channel 612 relative to the word line 628. For example, the charge trap structure 614 may include silicon nitride and may be separated from the word line 628 and the conductive channel 612 by a gate dielectric, such as silicon oxide. An amount of charge in the charge trap structure 614 affects an amount of current through the conductive channel 612 during a read operation of the memory cell 610 and indicates one or more bit values that are stored in the memory cell 610.

The memory die 600 includes multiple erase blocks, including a first block (block 0) 650, a second block (block 1) 652, and a third block (block 2) 654. Each block 650-654 includes a "vertical slice" of the physical layers 602 that includes a stack of word lines, illustrated as a first word line (WL0) 620, a second word line (WL1) 622, a third word line (WL2) 624, a fourth word line (WL3) 626, and a fifth word line (WL4) 628. Multiple conductive channels (having a substantially vertical orientation with respect to FIG. 6) extend through the stack of word lines. Each conductive channel is coupled to a storage element in each word line 620-628, forming a NAND string of storage elements. FIG. 6 illustrates three blocks 650-654, five word lines 620-628 in each block, and three conductive channels in each block for clarity of illustration. However, the memory die 600 may have more than three blocks, more than five word lines per block, and more than three conductive channels per block.

Data latches 662 are coupled to read/write circuitry 660. The read/write circuitry 660 is coupled to the conductive channels via multiple conductive lines, illustrated as a first bit line (BL0) 630, a second bit line (BL1) 632, and a third bit line (BL2) 634 at a "top" end of the conducive channels (e.g., farther from the substrate 604) and a first source line (SL0) 640, a second source line (SL1) 642, and a third source line (SL2) 644 at a "bottom" end of the conductive channels (e.g., nearer to or within the substrate 604). The read/write circuitry 660 is illustrated as coupled to the bit lines 630-634 via "P" control lines, coupled to the source lines 640-644 via "M" control lines, and coupled to the word lines 620-628 via "N" control lines. Each of P, M, and N may have a positive integer value based on the specific configuration of the memory die 600. In the illustrative example of FIG. 6, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 692 and a particular source line may be coupled to the top of the conductive channel 612. The bottom of the conductive channel 692 may be coupled (e.g., electrically coupled) to the bottom of the conductive channel 612. Accordingly, the conductive channel 692 and the conductive channel 612 may be coupled in series and may be coupled to the particular bit line and the particular source line.

The read/write circuitry 660 may operate as described with respect to the read/write circuitry 112 of FIG. 1. For example, data may be stored to storage elements coupled to the word line 628 and the read/write circuitry 660 may read bit values from the storage elements. As another example, the read/write circuitry 660 may apply selection signals to control lines coupled to the word lines 620-628, the bit lines 630-634, and the source lines 640-642 to cause a programming voltage (e.g., a voltage pulse or series of voltage pulses) to be applied across selected storage element(s) of the selected word line (e.g., the fourth word line 628).

During a read operation, the controller 130 may receive a request from a host device, such as the host device 154 of FIG. 1. The controller 130 may cause the read/write circuitry 660 to read bits from particular storage elements of the memory die 600 by applying appropriate signals to the control lines to cause storage elements of a selected word line to be sensed. Accordingly, the memory die 600 may be configured to read from and write data to one or more storage elements.

Figure 7:
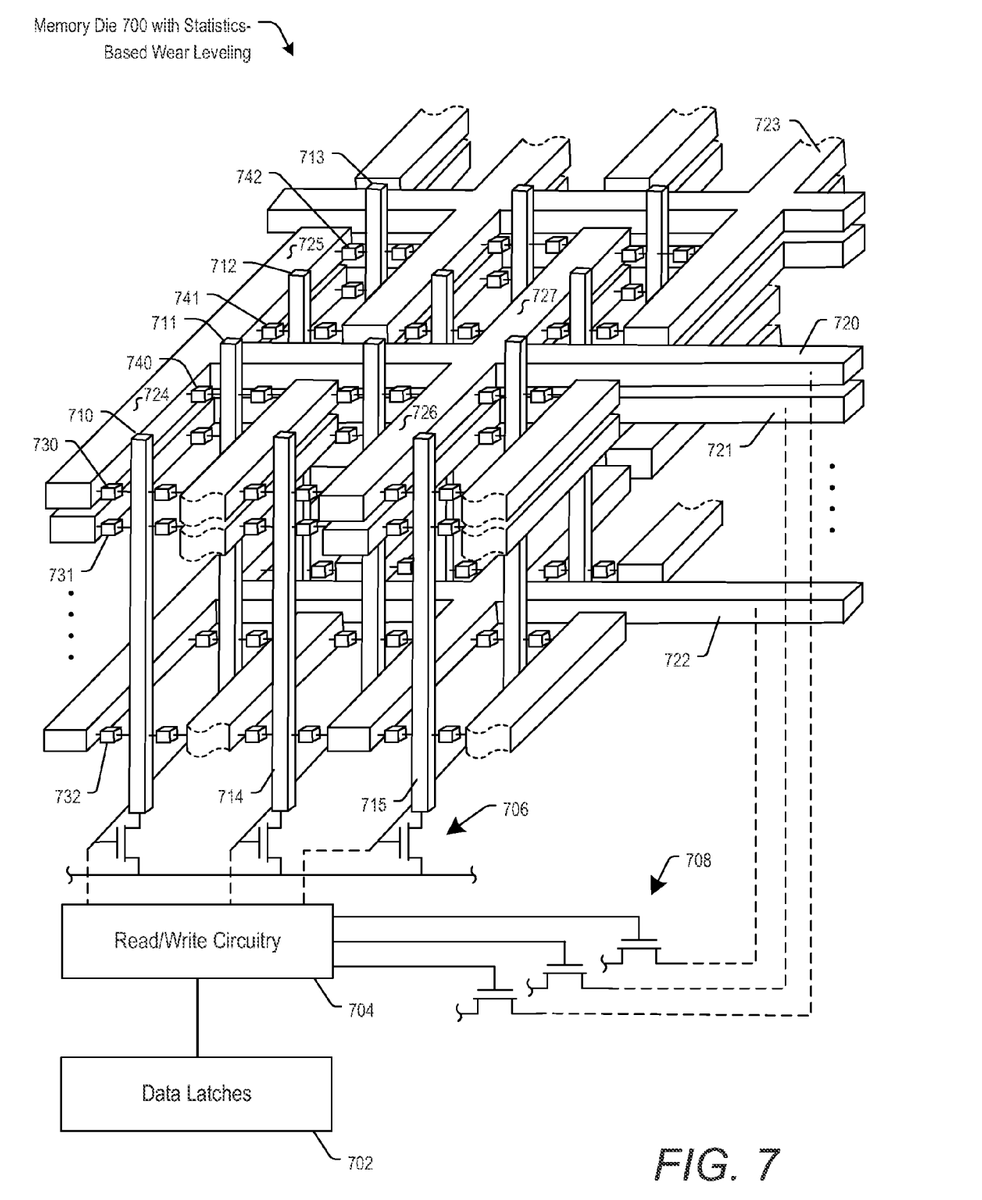
FIG. 7 is a block diagram of another particular embodiment of a memory die that may be included in the data storage device of FIG. 1.

FIG. 7 is a diagram of a particular embodiment of a memory die 700 in a ReRAM configuration. Operation of the memory die 700 may include statistics-based wear leveling, which may be initiated by the controller 130 of FIG. 1. The memory die 700 may be included in the data storage device 102 of FIG. 1. For example, the memory die 700 may correspond to the memory die 103 of FIG. 1.

In the embodiment illustrated in FIG. 7, the memory die 700 includes a vertical bit line ReRAM with a plurality of conductive lines in physical layers over a substrate (e.g., substantially parallel to a surface of the substrate), such as representative word lines 720, 721, 722, and 723 (only a portion of which is shown in FIG. 7) and a plurality of vertical conductive lines through the physical layers, such as representative bit lines 710, 711, 712, and 713. The word line 722 may include or correspond to a first group of physical layers, and the word lines 720, 721 may include or correspond to a second group of physical layers. Each of the word lines 720, 721, 722, and 723 may correspond to a storage region of the memory 104 of FIG. 1, and each of the word lines 720, 721, 722, and 723 may be associated with a particular counter, such as one of the multiple counters 427 or one of the multiple counters 537. In another example, each of the bit lines 710, 711, 712, and 713 corresponds to a storage region of the memory 104 of FIG. 1, and each of the bit lines 710, 711, 712, and 713 may be associated with a particular counter, such as one of the multiple counters 427 or one of the multiple counters 537.

The memory die 700 also includes a plurality of resistance-based storage elements (e.g., memory cells), such as representative storage elements 730, 731, 732, 740, 741, and 742, each of which is coupled to a bit line and a word line in arrays of memory cells in multiple physical layers over the substrate (e.g., a silicon substrate). The memory die 700 also includes data latches 702, such as the data latches 116 of FIG. 1, and read/write circuitry 704, such as the read/write circuitry 112 of FIG. 1. The read/write circuitry 704 is coupled to word line drivers 708 and bit line drivers 706.

In the embodiment illustrated in FIG. 7, each of the word lines includes a plurality of fingers (e.g., a first word line 720 includes fingers 724, 725, 726, and 727). Each finger may be coupled to more than one bit line. To illustrate, a first finger 724 of the first word line 720 is coupled to a first bit line 710 via a first storage element 730 at a first end of the first finger 724 and is coupled to a second bit line 711 via a second storage element 740 at a second end of the first finger 724.

In the embodiment illustrated in FIG. 7, each bit line may be coupled to more than one word line. To illustrate, the first bit line 710 is coupled to the first word line 720 via the first storage element 730 and is coupled to a third word line 722 via a third storage element 732.

During a write operation, the controller 130 of FIG. 1 may receive data from a host device, such as the host device 154 of FIG. 1. The controller 130 may send the data (or a representation of the data) to the memory die 700. For example, the controller 130 may encode the data prior to sending the encoded data to the memory die 700.

The read/write circuitry 704 may write the data to storage elements corresponding to the destination of the data. For example, the read/write circuitry 704 may apply selection signals to selection control lines coupled to the word line drivers 708 and the bit line drivers 706 to cause a write voltage to be applied across a selected storage element. For example, to select the first storage element 730, the read/write circuitry 704 may activate the word line drivers 708 and the bit line drivers 706 to drive a programming current (also referred to as a write current) through the first storage element 730. To illustrate, a first write current may be used to write a first logical value (e.g., a value corresponding to a high-resistance state) to the first storage element 730, and a second write current may be used to write a second logical value (e.g., a value corresponding to a low-resistance state) to the first storage element 730. The programming current may be applied by generating a programming voltage across the first storage element 730 by applying a first voltage to the first bit line 710 and to word lines other than the first word line 720 and applying a second voltage to the first word line 720. In a particular embodiment, the first voltage is applied to other bit lines (e.g., the bit lines 714, 715) to reduce leakage current in the memory die 700.

During a read operation, the controller 130 may receive a request from a host device, such as the host device 154 of FIG. 1. The controller 130 may cause the read/write circuitry 704 to read bits from particular storage elements of the memory die 700 by applying selection signals to selection control lines coupled to the word line drivers 708 and the bit line drivers 706 to cause a read voltage to be applied across a selected storage element. For example, to select the first storage element 730, the read/write circuitry 704 may activate the word line drivers 708 and the bit line drivers 706 to apply a first voltage (e.g., 0.7 volts (V)) to the first bit line 710 and to word lines other than the first word line 720. A lower voltage (e.g., 0 V) may be applied to the first word line 720. Thus, a read voltage is applied across the first storage element 730, and a read current corresponding to the read voltage may be detected at a sense amplifier of the read/write circuitry 704. The read current corresponds (via Ohm's law) to a resistance state of the first storage element 730, which corresponds to a logical value stored at the first storage element 730. The logical value read from the first storage element 730 and other elements read during the read operation may be provided to the controller 130.

Although counters have been described as being associated with storage regions of a memory, it should be appreciated that one or more counters may be specific to data. For example, a counter described herein may be associated with a data block and may "track" the data block instead of a particular storage region, such as by continuing to track the data block after the data block is copied from one storage region to another storage region (e.g., in connection with a storage reclamation or "garbage collection" process). In another example, a counter described herein may correspond to a "global" counter that indicates an approximate total number of P/E cycles performed throughout an entire memory (e.g., at all storage regions of the memory 104). Further, although a single normalization parameter has been described (the normalization parameter 142), it should be appreciated that multiple normalization parameters may be used. For example, each of the multiple normalization parameters may correspond to one of multiple counters, such as one of the multiple counters 427 or one of the multiple counters 537. One or more normalization parameters can be updated at the controller 130, such as via a firmware update.

Although the controller 130 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. As an illustrative example, the counter 134 may correspond to a hardware counter configured to store the value 136, and the PRNG 138 may include circuitry (such as logic gates) configured to generate the number 140.

Alternatively or in addition, one or more aspects of the data storage device 102 may be implemented using a microprocessor or microcontroller programmed (e.g., by executing instructions) to perform operations described herein, such as one or more operations of the methods 200, 300. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM). As an illustrative example, the counter 134 may correspond to instructions executable by a processor to store the value 136, and the PRNG 138 may correspond to instructions executable by the processor to generate the number 140.

To further illustrate, the controller 130 may include a processor that is configured to execute instructions to perform certain operations described herein. The instructions may include general purpose instructions, and the processor may include a general purpose execution unit operable to execute general purpose instructions. As an illustrative example, the processor may execute instructions specifying physical addresses of the memory 104 to initiate a first number of write operations to the memory 104. The processor may execute instructions to increment the value 136 of the counter 134 in response to performing a subset of the write operations, such as by executing a conditional instruction that specifies that the counter is to be incremented upon satisfaction of a condition (e.g., based on the determination, at 208, of FIG. 2).

It should be appreciated that one or more operations described herein as being performed by the controller 130 may be performed at the memory 104. As an illustrative example, "in-memory" ECC operations may be performed at the memory die 103 alternatively or in addition to performing such operations at the controller 130.

The data storage device 102 may be attached to or embedded within one or more host devices, such as within a housing of a host communication device (e.g., the host device 154). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
  at data storage device including a resistive random access memory (ReRAM) having a three-dimensional (3D) memory configuration that is monolithically formed in one or more physical levels of arrays of memory cells having an active area disposed above a silicon substrate, and wherein the data storage device further includes circuitry associated with operation of the memory cells, performing:
    storing data in the ReRAM by performing a plurality of write operations to a first number of distinct addresses of the ReRAM, the distinct addresses corresponding to a particular storage region of the ReRAM that is tracked by a counter; and
    incrementing a value of the counter a second number of times responsive to storing the data to the distinct addresses, wherein the second number is less than the first number.

2. The method of claim 1, further comprising determining a ratio between a number of cells programmed by a first write operation of the plurality of write operations and a normalization parameter, and wherein the value of the counter, based on the determined ratio, statistically indicates a number of program/erase cycles.

3. The method of claim 2, wherein the normalization parameter corresponds to a data block size of data blocks written to the ReRAM.

4. The method of claim 3, wherein the first write operation writes a first data block to the ReRAM, the first data block having the data block size.

5. The method of claim 4, wherein the plurality of write operations further includes a second write operation, and wherein the second write operation writes second data to the ReRAM, the second data having a data size that is less than the data block size.

6. The method of claim 5, wherein the second data corresponds to a modification of one or more values of the first data block.

7. The method of claim 2, further comprising, for each of the write operations of the plurality of write operations, determining a number, such that a probability of the number being equal to one corresponds to the ratio.

8. The method of claim 7, wherein the value of the counter is incremented each time the number is equal to one.

9. The method of claim 1, wherein the value of the counter approximates a number of program/erase (P/E) cycles associated with the particular storage region of the ReRAM.

10. The method of claim 1, wherein the data storage device further includes a controller coupled to a memory die, wherein the memory die includes the ReRAM and the circuitry, and wherein the value of the counter is incremented by the controller.

11. A data storage device comprising:
  a resistive random access memory (ReRAM) having a three-dimensional (3D) memory configuration that is monolithically formed in one or more physical levels of arrays of memory cells having an active area disposed above a silicon substrate;

circuitry associated with operation of the memory cells; and a controller, wherein the controller is coupled to the ReRAM, wherein the controller is configured to perform a plurality of write operations to a first number of distinct addresses of the ReRAM, the first number of distinct addresses corresponding to a particular storage region of the ReRAM that is tracked by a counter, and to increment a value of the counter a second number of times responsive to storing the data to the distinct addresses, wherein the second number is less than the first number.

12. The data storage device of claim 11, wherein the controller is further configured to determine a ratio between a number of cells programmed by a first write operation of the plurality of write operations and a normalization parameter, and wherein the value of the counter, based on the determined ratio, statistically indicates a number of program/erase cycles.

13. The data storage device of claim 12, wherein the normalization parameter corresponds to a data block size of data blocks written to the ReRAM.

14. The data storage device of claim 13, wherein the first write operation writes a first data block to the ReRAM, wherein the first data block has the data block size.

15. The data storage device of claim 14, wherein the plurality of write operations further includes a second write operation, and wherein the second write operation writes second data to the ReRAM, the second data having a data size that is less than the data block size.

16. The data storage device of claim 15, wherein the second data corresponds to a modification of one or more values of the first data block.

17. The data storage device of claim 12, wherein the controller includes a pseudo-random number generator (PRNG) that is configured to generate a number, for each of the write operations of the plurality of write operations, such that a probability of the number being equal to one corresponds to the ratio.

18. The data storage device of claim 17, wherein the value of the counter is incremented each time the number is equal to one.

19. The data storage device of claim 11, wherein the value of the counter approximates a number of program/erase (P/E) cycles associated with the particular storage region of the ReRAM, and wherein the controller further includes multiple counters corresponding to multiple storage regions of the ReRAM.

20. The data storage device of claim 11, further comprising a memory die, wherein the memory die includes the ReRAM and the circuitry, and wherein the controller includes the counter.

* * * * *